US012624451B2

(12) United States Patent
Aminoff et al.

(10) Patent No.: US 12,624,451 B2
(45) Date of Patent: May 12, 2026

(54) ATOMIC LAYER DEPOSITION APPARATUS

(71) Applicant: BENEQ OY, Espoo (FI)

(72) Inventors: Hulda Aminoff, Espoo (FI); Pekka Soininen, Espoo (FI); Pekka J. Soininen, Espoo (FI); Ville Miikkulainen, Espoo (FI)

(73) Assignee: HERVANNAN SAUNA OY, Espoo (FI)

( * ) Notice: Subject to any disclaimer, the term of this patent is extended or adjusted under 35 U.S.C. 154(b) by 731 days.

(21) Appl. No.: 17/622,274

(22) PCT Filed: Jun. 26, 2020

(86) PCT No.: PCT/FI2020/050463
§ 371 (c)(1),
(2) Date: Dec. 23, 2021

(87) PCT Pub. No.: WO2020/260767
PCT Pub. Date: Dec. 30, 2020

(65) Prior Publication Data
US 2022/0259733 A1     Aug. 18, 2022

(30) Foreign Application Priority Data
Jun. 28, 2019     (FI) ..................................... 20195588

(51) Int. Cl.
*C23C 16/455*        (2006.01)
*C23C 16/44*         (2006.01)
*C23C 16/448*        (2006.01)

(52) U.S. Cl.
CPC .... *C23C 16/45544* (2013.01); *C23C 16/4411* (2013.01); *C23C 16/448* (2013.01)

(58) Field of Classification Search
CPC ........... C23C 16/45544; C23C 16/4411; C23C 16/448

(Continued)

(56) References Cited

U.S. PATENT DOCUMENTS 5,578,132 A * 11/1996 Yamaga .............. C23C 16/4412
219/390
5,855,680 A * 1/1999 Soininen ............. C23C 16/4583
118/725

(Continued)

FOREIGN PATENT DOCUMENTS

GB        2426252 A    11/2006
JP       2018006533 A   1/2018

OTHER PUBLICATIONS

International Search Report issued by the Finnish Patent and Registration Office acting as the International Searching Authority in relation to International Application No. PCT/FI2020/050463 dated Oct. 26, 2020 (7 pages).

(Continued)

*Primary Examiner* — Charlee J. C. Bennett
(74) *Attorney, Agent, or Firm* — Carter, DeLuca & Farrell, LLP

(57)        ABSTRACT

An atomic layer deposition apparatus including an atomic layer deposition reactor and a reactor door. The reactor door is arranged against the end edge of the reactor in a closed position of the reactor. The apparatus having a cooling arrangement for cooling the reactor door having a shell structure surrounding the reactor from the outside of the reactor such that a cooling channel is formed between the shell structure and the at least one side wall of the reactor; a heat exchanger element arranged in the cooling channel in an area of the end edge; and a ventilation discharge connection in connection with the cooling channel provided at a distance from the edge end.

16 Claims, 2 Drawing Sheets

(58) Field of Classification Search
USPC ........................................................ 118/719
See application file for complete search history.

(56) References Cited

U.S. PATENT DOCUMENTS

| | | | |
|---|---|---|---|
| 6,258,170 B1 | 7/2001 | Somekh et al. | |
| 9,816,182 B2 * | 11/2017 | Tateno | C23C 16/402 |
| 2001/0042594 A1 * | 11/2001 | Shamouilian | H01J 37/32458 |
| | | | 118/724 |
| 2003/0066482 A1 | 4/2003 | Pokharna et al. | |
| 2006/0175011 A1 | 8/2006 | Shinriki et al. | |
| 2007/0084406 A1 | 4/2007 | Yudovsky et al. | |
| 2007/0159791 A1 * | 7/2007 | Pongracz | H05K 7/20145 |
| | | | 361/688 |
| 2007/0272155 A1 * | 11/2007 | Nozawa | H01L 21/67109 |
| | | | 118/724 |
| 2008/0305031 A1 * | 12/2008 | Kim | B82Y 30/00 |
| | | | 422/219 |
| 2009/0004405 A1 | 1/2009 | Merry et al. | |
| 2009/0029486 A1 | 1/2009 | Ueno et al. | |
| 2011/0076632 A1 * | 3/2011 | Kusakabe | C30B 35/00 |
| | | | 165/104.19 |
| 2014/0133099 A1 * | 5/2014 | Campbell | H05K 7/20818 |
| | | | 361/698 |
| 2014/0287375 A1 * | 9/2014 | Kosugi | F27D 9/00 |
| | | | 438/795 |
| 2015/0040822 A1 | 2/2015 | Olsen et al. | |
| 2015/0162104 A1 * | 6/2015 | Soininen | G21B 3/006 |
| | | | 376/108 |
| 2015/0340256 A1 * | 11/2015 | Do | H01L 31/18 |
| | | | 438/95 |

OTHER PUBLICATIONS

Written Opinion of the International Searching Authority issued by the Finnish Patent and Registration Office acting as the International Searching Authority in relation to International Application No. PCT/FI2020/050463 dated Oct. 26, 2020 (8 pages).
Finnish Search Report issued by the Finnish Patent and Registration Office in relation to Finnish Application No. 20195588 dated Feb. 12, 2020 (2 pages).

* cited by examiner

ATOMIC LAYER DEPOSITION APPARATUS

CROSS-REFERENCE TO RELATED APPLICATIONS

This application is a national phase entry under 35 U.S.C. 371 of PCT International Application No. PCT/FI2020/050463 filed Jun. 26, 2020, which claims priority to Finnish Patent Application No. 20195588, filed Jun. 28, 2019, the disclosure of each of these applications is expressly incorporated herein by reference in their entirety.

FIELD OF THE INVENTION

The present invention relates to an atomic layer deposition apparatus.

BACKGROUND OF THE INVENTION

Atomic layer deposition apparatus conventionally comprises an atomic layer deposition (ALD) reactor and precursor sources for supplying precursors to the ALD reactor. The ALD reactor may have operating temperature up to 600° C. or even more. In addition, the process typically uses about 1 mbar absolute pressure, so the reaction space must be within the pressure-resistant structures. High temperatures increase the temperature of the apparatus and parts thereof causing safety issues for users and also thermal stress issues for the apparatus itself. Therefore, the reaction chambers are most commonly located within a solid pressure vessel. The reaction chamber can be heated by directly attached resistors, internal chamber heaters, or by eternally heating the shell of the pressure vessel. However there is a problem with a large heated mass that slows down heating and cooling between process operations. In addition, the heat load that is escaping to a room in which the apparatus is positioned, is great especially if no insulators are used. Insulators, on the other hand, often contain dusty materials, with the risk of dust forming in the clean room. The externally heated reactors are often tubular, making them easily lengthy because of the temperature gradient control and keeping the door cool enough which causes problems in the size of the apparatus and its operation.

When using internal heaters heat the pressure vessel must be cooled and in prior art the pressure vessel is cooled by water cooling. However there are many problems related to water cooling, especially the risk relating to leaking of water in the cooling water system which leads to water damage. Further running water into the drain is expensive and water circuits may have problems with algae growth and corrosion.

BRIEF DESCRIPTION OF THE INVENTION

An object of the present invention is to provide an atomic layer deposition apparatus which enables removing water cooling without increasing the size of the reactor and without having to use external insulators and further keeping the reactor door cool for safety reasons and without limiting the operating temperatures.

The invention is based on the idea of providing an atomic layer deposition apparatus for processing substrates according to principles of atomic layer deposition which the apparatus comprising an atomic layer deposition reactor, a reactor door and a cooling arrangement for cooling the reactor door. The cooling arrangement uses surrounding room air for cooling.

The reactor has an opening to a deposition space inside the reactor and at least one side wall and an end edge. The reactor in this application is commonly used for a vacuum chamber and a deposition space provided within the vacuum chamber. The deposition space is preferably arranged within a reaction chamber provided within the vacuum chamber. The reactor door is provided in connection with the opening for opening and closing the reactor and the reactor door is arranged against the end edge of the reactor in a closed position of the reactor. The reactor may be provided as a chamber in which one end of the chamber comprises an opening to the deposition space. The opening may extend over the entire area of the end of the chamber or alternatively the opening may form only part of the end of the chamber. In a preferred embodiment of the invention the reactor is arranged as a cylindrical chamber having only one side wall surrounding the chamber and two end walls opposite to each other. Preferably, the reactor is lying on its side wall so that the end walls are vertical or substantially vertical. In a preferred embodiment of the invention the reactor is provided such that the reactor is at the height of the user's waistline, whereby the space under the reactor may be provided with equipment or other process-related means.

One or more separate reaction chambers can be arranged in the deposition space. In the apparatus according to the invention objects subjected to atomic layer deposition are arranged inside the reaction chamber(s). Separate vapor or precursor channels can be arranged to the reaction chamber to facilitate ALD deposition. Vacuum environment needed by the ALD process is provided by the deposition space.

The cooling arrangement comprises a shell structure, a heat exchanger element and a ventilation discharge connection forming the cooling arrangement. The shell structure is arranged to surround the reactor from the outside of the reactor such that a cooling channel is formed between the shell structure and the at least one side wall of the reactor. In other words, the shell structure is arranged around the rector such that the shape of the reactor is irrelevant which means that when the reactor is cylindrical and comprises only one side wall, the shell structure is arranged to extend around the one side wall and to form the cooling channel between the shell structure and the one side wall, and when the reactor comprises more than one side wall, the shell structure is provided such that the cooling channel is formed between the shell structure and the side walls. The heat exchanger element is arranged in the cooling channel in an area of the end edge. The heat exchanger element comprises air intakes for providing a flow connection from outside of the apparatus to the inside of the cooling channel. The air intakes are arranged such that the air flowing in the cooling channel passes through the heat exchanger element such that heat energy of the air coming from outside of the apparatus is conducted from the air intakes into the heat transfer element and further from the heat transfer element to the end edge of the reactor for cooling the end edge, because air coming from outside of the apparatus and flowing through the cooling channel has a temperature significantly lower than what is the temperature inside the deposition space and which is radiated to the at least one side wall of the reactor.

The ventilation discharge connection is arranged in connection with the cooling channel and provided at a distance from the edge end of the reactor for discharging gas coming from air intakes of the heat exchanger element. In a preferable embodiment of the invention the ventilation discharge connection is arranged on the opposite end of the reactor than the edge end of the reactor comprising the heat exchanger such that the cooling channel extends along the length of the side wall and between the heat exchanger and the ventilation discharge connection.

In an embodiment of the invention the reactor comprises a flange structure protruding from the at least one side wall of the reactor away from the deposition space. In other words, the flange structure is arranged to extend from the at least one side wall toward the shell structure surrounding the at least one side wall. However, the flange structure is arranged such that there is a gap between the shell structure and the flange structure such that the cooling channel is formed between the shell structure and the at least one side wall comprising the flange structure. The flange structure is provided at the end edge of the reactor such that the reactor door is arranged against the flange structure in the closed position of the reactor door.

In an embodiment of the invention the heat exchanger element is arranged against the flange structure for providing cooling heat transfer from the heat exchanger element to the flange structure for cooling the reactor door arranged against the flange structure. In other words, the heat exchanger element is arranged in contact with the flange structure such that cooling heat is transferred from the heat exchanger element to the flange structure such that heat coming from the deposition space to the at least one side wall of the reactor is not transferred straight to the reactor door, but the flange structure receiving cooling heat from the heat exchanger element is arranged to cool the connection between the end edge of the reactor and the reactor door. The heat exchanger element is preferably provided against the flange structure such that the heat exchanger element is on the opposite side of the flange structure than the reactor door which is arranged against the end edge of the reactor comprising the flange structure.

In an embodiment of the invention the heat exchanger element is provided in contact with the flange structure forming a heat transfer connection with the flange structure for providing a cooling heat transfer from the heat exchanger element to the flange structure for cooling the reactor door arranged against the flange structure. In this embodiment of the invention the heat exchanger element is provided in connection with the flange structure in the cooling channel such that the heat exchanger element is provided between the shell structure and the flange structure within the cooling channel.

In an embodiment of the invention the heat exchanger element is arranged to form a heat transfer connection with the side wall of the reactor in the area of the end edge for providing a cooling heat transfer from the heat exchanger element to the end edge for cooling the reactor door. The heat exchanger element is arranged in contact with the side wall of the reactor in the proximity of the end edge of the reactor or in the proximity of the flange structure arranged at the end edge of the reactor. The heat exchanger element is arranged to cool the end edge area of the reactor such that the heat coming from the deposition space will cool at the end edge of the reactor before transferring to the reactor door.

In an embodiment of the invention the heat exchanger element is arranged in the cooling channel at a distance of up to five centimetres from the end edge of the reactor, preferably at a distance of up to one centimetre from the end edge of the reactor. This means that the heat exchanger is provided in the proximity of the reactor door but not in contact with the reactor door when the reactor door is arranged against the end edge of the reactor in the closed position of the reactor.

In an embodiment of the invention the heat exchanger element is made of material having thermal conductivity of more than 50 $W \cdot m^{-1} \cdot K^{-1}$, preferably more than 100 $W \cdot m^{-1} \cdot K^{-1}$. The material of the heat exchanger can be for example aluminium, magnesium or silicon carbide.

In an embodiment of the invention the cooling channel is arranged to extend between the ventilation discharge connection and the end edge of the reactor. In other words, the opening to the cooling channel is arranged at the end edge of the reactor such that the side wall of the reactor at the end edge and the shell structure form the opening to the cooling channel or the flange structure provided at the end edge and the shell structure form the opening to the cooling channel.

In an embodiment of the invention the shell structure comprises a collar arranged around the reactor in the area of the end edge. The collar comprises a wall portion protruding away from the shell structure in a transverse direction with respect to the at least one side wall of the reactor, and a collar portion extending from the wall portion to a direction of the end edge of the reactor such that the collar portion is arranged to form together with the end edge of the reactor an opening to the cooling channel. The collar may be uniform with the rest of the shell structure or it may be separately connected to the rest of the shell structure for example through welding. The collar is provided further away from a central axis of the reactor than the rest of the shell structure. Alternatively or in addition the collar is provided further away from the at least one side wall of the reactor than the rest of the shell structure. The rest of the shell structure extending from the collar to the ventilation discharge connection. The collar is arranged in connection with the shell structure for guiding the cooling channel between the shell structure and the at least one side wall in a manner that the cooling channel is arranged to turn the direction at least once, preferably twice on the way from the beginning of the cooling channel to the ventilation discharge connection, which the beginning of the cooling channel is in the area of the end edge of the reactor.

In an embodiment of the invention the collar is arranged to guide the cooling channel from the end edge toward the side wall of the reactor such that the cooling channel is arranged to extend from the opening towards the wall portion of the collar by extending along the collar portion, and arranged to turn towards the at least one side wall of the reactor by extending along the wall portion of the collar and arranged to turn towards the ventilation discharge connection by extending along the at least one side wall of the reactor between the shell structure and the at least one side wall. In a preferred embodiment of the invention the cooling channel extending along the collar portion is arranged to extend between the collar portion and the flange structure and the cooling channel extending along the wall portion of the collar is arranged to extend between the wall portion and the flange structure.

In an embodiment of the invention the heat exchanger element and the wall portion of the collar are arranged to form part of the cooling channel which is extending transverse with respect to the side wall of the reactor. The heat exchanger element is preferably formed such that air intakes are provided at least in one part of the heat exchange element and the other part which is arranged to have the connection with the flange structure or with the at least one side wall is solid. The heat exchanger element is a uniform piece which is preferably at least partly planar and thereby forming together with the wall portion of the collar a portion of the cooling channel extending transversely relative to the at least one side wall. In other words, the heat exchanger element is arranged to form part of the cooling channel such that the air intakes through the heat exchanger element provide an air flow connection in the part of the cooling channel which is transverse to the part of the cooling channel which is formed between the wall portion of the collar and the heat exchange element. The heat exchange element preferably comprises a portion, which is preferably solid and forms a connection with the flange structure and a portion, which is arranged to extend in the cooling channel and to provide the flow connection in the cooling channel.

In an embodiment of the invention the shell structure comprising the collar portion is arranged to extend along the length of the side wall of the reactor and such that the collar portion is arranged to form a hood around the reactor door. In other words, the shell structure is arranged to extend at the level of the reactor door when the door is arranged in the close position, i.e. the hood is formed outside the end edge of the reactor. The hood is arranged to direct heated gas from the opening of the reactor and from the reactor door to the cooling channel.

In an embodiment of the invention the reactor door comprises at least one radiation shield plate connected to the reactor door at the side of the deposition space to prevent radiation heat from entering the reactor door. The cooling arrangement therefore comprises the radiation shields inside the deposition space and in connection with the reactor door for cooling the reactor door.

In an embodiment of the invention the reactor door comprises a door structure and a perforated plate arranged at a distance from the door structure such that a space is arranged between the door structure and the perforated plate. The perforated plate is arranged to form an outer surface of the reactor door. The perforated plate provides air passage toward the door structure of the reactor door for cooling the reactor door and prevents heat transferring from the door structure of the reactor door to the user.

In an embodiment of the invention the perforated plate comprises inlet perforations at a lower part of the perforated plate formed to provide an air passage from outside of the perforated plate to the space between the door structure and the perforated plate. Alternatively the perforated plate comprises inlet perforations at a lower part of the perforated plate formed to provide an air passage from outside of the perforated plate to the space between the door structure and the perforated plate and outlet perforations at an upper part of the perforated plate formed to provide an air passage from the space between the door structure and the perforate plate to outside of the perforated plate for air to be guided to the collar.

In one embodiment of the invention, the heat exchanger element is arranged between at least one side wall of the reactor and the shell structure such that the heat exchanger element is arranged to extend around the reactor and from at least one side wall to the shell structure. In other words, the heat exchanger is in this embodiment of the invention a one piece element which surrounds the reactor.

In an embodiment of the invention the cooling channel is arranged to extend around the reactor such that the opening of the cooling channel is formed between the shell structure and the end edge of the reactor and extending around the end edge of the reactor.

An advantage of the invention is that the heat exchanger element surrounding the end edge of the reactor or the flange structure is arranged to smooth out the cooling flow around the reactor and at the same time effectively cooling the end edge of the reactor for cooling the reactor door. When the reactor door is open, excess heat and possible chemical vapors are directed to the cooling channel. The perforated plate in connection with the reactor door provides air passage from outside the apparatus to the door structure for cooling the reactor door and also serving as a contact protection against the structures of the reactor door that heat up because of the heat coming from the deposition space. Inside the deposition space, radiation shield plates are attached to the reactor door to prevent the radiation heat from entering the reactor door for cooling the reactor door.

BRIEF DESCRIPTION OF THE DRAWINGS

The invention is described in detail by means of specific embodiments with reference to the enclosed drawings, in which.

DETAILED DESCRIPTION OF THE INVENTION

Figure 1B:
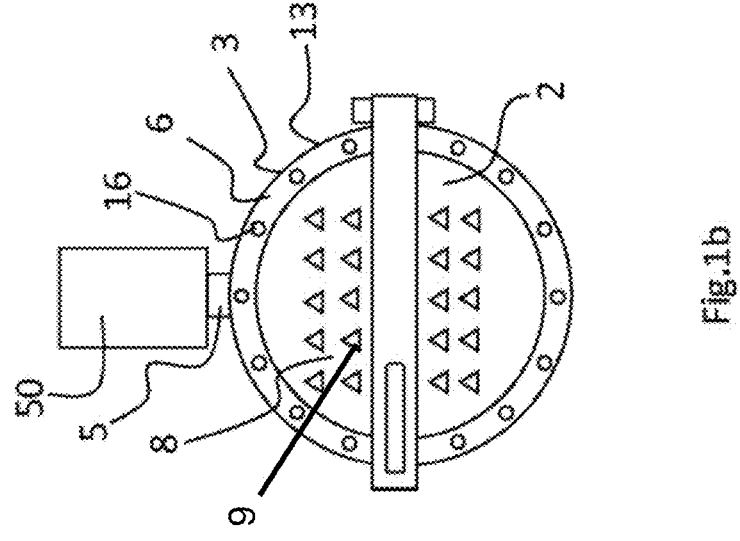
FIG. 1b shows the apparatus shown in FIG. 1a as seen from the front of the reactor door.
Figure 1A:
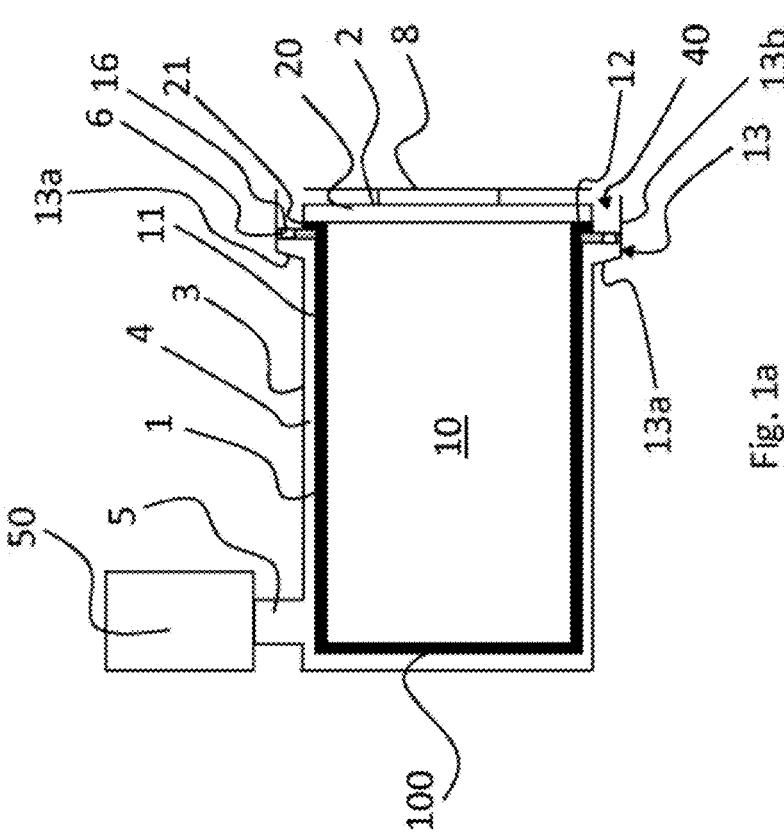
FIG. 1a shows one embodiment of the apparatus according to the invention as a side view.

FIG. 1a shows an embodiment of the apparatus according to the invention in which the reactor 1 is shown from side. Figure shows that the reactor 1 comprises a deposition space 10 within the reactor 1 and that the reactor comprises one side wall 11. FIG. 1b shows that the reactor 1 is cylindrical so that the one side wall 11 is arranged to surround the deposition space on all sides. The reactor 1 further comprises an end edge 12 on the side where the reactor door 2 is provided. An opening to the deposition space 10 is provided on one end of the reactor 1 which is closed at the other end 100. In this embodiment of the invention a shell structure 3 is arranged to surround the reactor 1 from the outside of the reactor 1 such that the shell structure 3 forms a cooling channel 4 between the at least one side wall 11 and the shell structure 3 and also between the end 100 and the shell structure 3 such that the cooling channel 4 surrounds the reactor from all other sides than at the opening. Although the reactor 1 does not show a reaction chamber within the reactor 1 it must be understood that the reactor 1 comprises a vacuum chamber and a deposition space within the vacuum chamber, which the deposition space is normally provided as a reaction chamber. The reactor 1 is preferably made of stainless steel.

The reactor door 2 is arranged against the end edge 12 of the reactor 1 in the closed position of the reactor 1. The reactor door 2 comprises a door structure 20 and a perforated plate 8 such that a space is formed between the door structure 20 and the perforated plate 8.

The cooling arrangement according to the invention comprises the shell structure 3 surrounding the reactor 1 and forming the cooling channel 4 between the shell structure 3 and the at least one side wall 11 of the reactor 1, and a heat exchanger element 6 arranged in the cooling channel in an area of the end edge 12, and a ventilation discharge connection 5, 50 in connection with the cooling channel 4. The ventilation discharge connection 5, 50 preferably comprises an exhaust channel 5 and a discharge unit 50 for discharging air coming through the cooling channel 4. The ventilation discharge connection 5, 50 is provided at a distance from the edge end 12 of the reactor 1 and preferably such that the ventilation discharge connection 5, 50 is provided on the opposite end than the end edge 12 of the reactor 1 such that the cooling channel 4 is arranged to extend along the length of the side wall 11 of the reactor.

The shell structure 3 preferably comprises a collar 13 around the end edge 12 of the reactor 1 and the heat exchanger element 6 is arranged within the collar 13. The collar 13 comprises a wall portion 13a protruding away from the shell structure 3 in a transverse direction with respect to the at least one side wall 11 of the reactor 1 and a collar portion 13b extending substantially parallel to the at least one side wall 11 of the reactor 1. The heat exchanger element 6 provided within the collar 13 is preferably arranged to extend from the at least one side wall 11 of the reactor 1 to the collar portion 13b. The heat exchanger element 6 comprises air intakes 16 for providing a flow connection from outside of the apparatus to the inside of the cooling channel 4 and the heat exchanger element 6 is arranged within the shell structure 4 such that the air intakes 16 are provided in the part of the cooling channel 4 extending along the collar portion 13b. As shown in the FIG. 1a the heat exchanger element 6 can be provided against a flange structure 21 protruding from the at least one side wall 11 of the reactor 1 away from the deposition space 10. The flange structure 21 is provided at the end edge 12 of the reactor 1 such that the reactor door 2 is arranged against the flange structure 21 in the closed position of the reactor door 2. The end edge 12 of the reactor 1 and the collar portion 13b of the collar 13 form an opening 40 to the cooling channel 4.

The collar 13 is arranged to direct the cooling channel 4 such that the flow direction of the air coming from outside of the apparatus and further through the heat exchanger element 6 is changed. By changing the direction of the air flow and extending the air flow path between the shell structure and the reactor 1, the flange structure 12 and thus the reactor door 2 are more efficiently cooled.

As can be seen from the FIG. 1a the heat exchanger element 6 is preferably a planar structure comprising air intake holes 16 through the heat exchanger element 6 at least on that part of the heat exchanger element 6 that is provided in the cooling channel 4 such that air can pass through the air intakes 16. Part of the heat exchanger element 6 can be arranged against the flange structure 21 for heat transfer from the heat exchanger element 6 to the flange structure 21 and part of the heat exchanger element 6 can be arranged to extend in the cooling channel 4 such that the air intakes 16 are positioned in the cooling channel 4 for providing air passage through the air intakes in the cooling channel 4.

FIG. 1b shows the apparatus shown in FIG. 1a as seen from the front of the reactor door 2. The reactor door 2 comprises a perforated plate 8 forming an outer surface of the reactor door 2. The perforated plate 8 comprises inlet perforations 9 formed to provide an air passage from outside of the perforated plate 8 to the space between the door structure 20 and the perforated plate 8. FIG. 1b shows perforations 9 both on the lower part of the perforated plate 8 as well as on the upper part of the perforated plate 8. However, perforations 9 need not to be arranged both at the lower part and the upper part of the perforated plate 8. The reactor door 2 is surrounded by the shell structure 3 comprising the collar 13 and the heat exchanger element 6 in the vicinity of the end edge 12 of the reactor 1. As can be seen from the FIG. 1b in one embodiment of the invention the heat exchanger element 6 is arranged to be a single element provided within the cooling channel 4 and extending around the reactor 1. However, the heat exchanger element 6 may be formed from multiple parts and such that the heat exchanger element 6 is only partly surrounding the reactor 1. The heat exchanger element 6 preferably comprises air intakes 16 at regular intervals and the heat exchanger element 6 shown in the figures is only an example of the heat exchanger element 6.

Figure 2B:
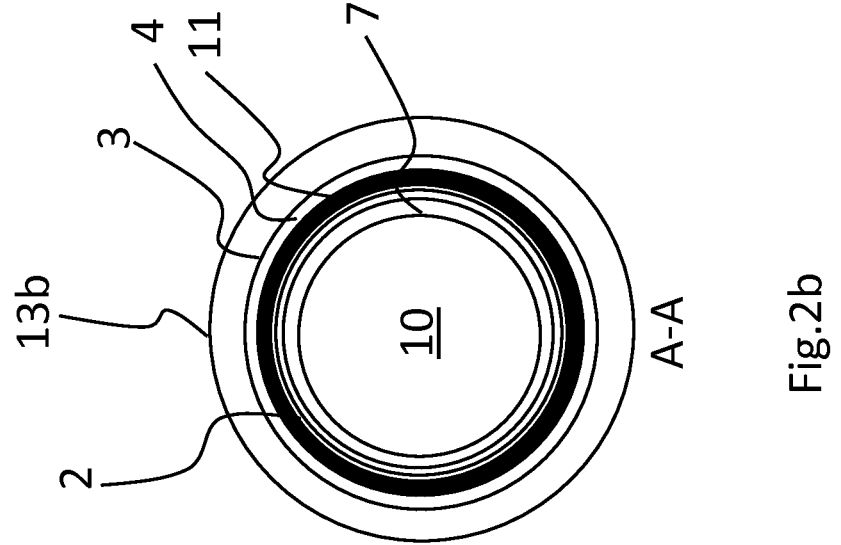
FIG. 2b shows the apparatus shown in FIG. 2a as seen along the line A-A.
Figure 2A:
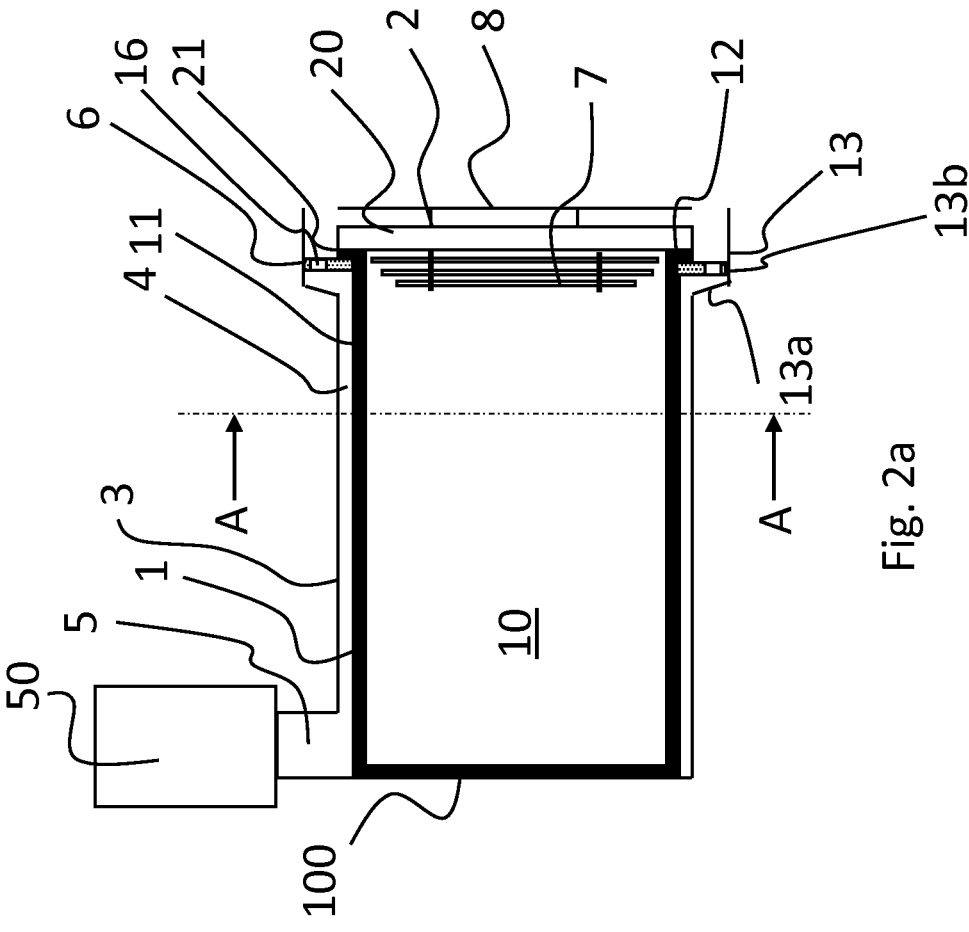
FIG. 2a shows another embodiment of the apparatus according to the invention as a side view.

FIG. 2a shows another embodiment of the apparatus according to the invention as a side view. In this embodiment the cooling channel 4 is only arranged in connection with the side walls 11 of the reactor 1 surrounding the cylindrical reactor 1. However, the form of the reactor is not limited to the cylindrical form but other forms are possible too. The reactor door 2 is provided with radiation shield plates 7 attached to the inner side of the reactor door 2 facing toward the deposition space 10. The radiation shield plates 7 are arranged to prevent excess heat from entering to the door structure 20 for cooling the reactor door 2. The structures of the apparatus shown in FIG. 2a are otherwise similar as described in connection with FIG. 1a and are not repeated again.

The cooling arrangement for cooling the reactor door 2 comprises on one hand the shell structure 3 forming the cooling channel 4 between the shell structure 3 and the at least one side wall 11 of the reactor 1, the heat exchanger element 6 arranged in the cooling channel 4 in an area of the end edge 12 for providing a flow connection for air coming from outside of the apparatus to the inside of the cooling channel 4 and the ventilation discharge connection 5, 50 in connection with the cooling channel 4 for discharging air coming from air intakes of the heat exchanger element 6; on the other hand the radiation shied plates 7 preventing excess heat from entering to the reactor door 2 from inside of the reactor 1; and further the door structure 20 forming together with the perforated plate 8 the space between the door structure 20 and the perforated plate 8 for cooling air passage within the reactor door 2.

FIG. 2b shows a cut-out of the apparatus shown in FIG. 2a as seen along the line A-A. It can be seen that the collar 13 extends from the rest of the shell structure 3 away from the deposition space 10. The cooling channel 4 is arranged between the shell structure 3 and the side wall 11 of the reactor 1 extending further between the collar 13 and the side wall 11 of the reactor 1 or between the collar 13 and the flange structure 21 (not shown in FIG. 2b). The radiation shield plates 7 are provided to the reactor door 2 in the side of the deposition space 10 for preventing heat from the deposition space 10 from entering the reactor door 2. The rest of the reactor door 2 or the heat exchanger 6 are not shown in FIG. 2b but they are already described in connection with FIGS. 1a-2a and apply also to the embodiment shown in FIG. 2b.

The invention has been described above with reference to the examples shown in the figures. However, the invention is in no way restricted to the above examples but may vary within the scope of the claims.

The invention claimed is:

1. An atomic layer deposition apparatus for processing substrates, the apparatus comprising:
   a reactor configured for atomic layer deposition, the reactor defining an opening to a deposition space within the reactor, the reactor comprising at least one side wall, an end edge, and a flange structure protruding from the at least one side wall of the reactor away from the deposition space, the flange structure being provided at the end edge of the reactor; and
   a reactor door configured to open and close the opening of the reactor, the reactor door being arranged against the flange structure in a closed position of the reactor, the reactor door including at least one radiation shield plate disposed on an inner side of the reactor door facing toward the deposition space for limiting an amount of excess heat that enters the reactor door from within the reactor, the apparatus further comprises a cooling arrangement for cooling the reactor door, the cooling arrangement comprising:

a shell structure surrounding an exterior of the reactor such that a cooling channel is formed between the shell structure and the at least one side wall of the reactor;

a heat exchanger element arranged in the cooling channel adjacent the end edge, the heat exchanger element having at least one air intake that provides fluid communication between an exterior of the apparatus and the cooling channel, a portion of the heat exchanger element being in contact with the flange structure to form a heat transfer connection with the flange structure for cooling the reactor door arranged against the flange structure;

a ventilation discharge connection fluidly connected to the cooling channel, the ventilation discharge connection being provided at a distance from the end edge of the reactor for discharging gas entering through the at least one air intake of the heat exchanger element; and a collar arranged around the reactor adjacent the end edge, the collar comprising:

a wall portion protruding away from the shell structure in a transverse direction with respect to the at least one side wall of the reactor; and a collar portion extending from the wall portion toward the end edge of the reactor, the collar portion being arranged to form together with the end edge of the reactor an opening to the cooling channel;

wherein the cooling channel extends from the opening along the collar portion toward the wall portion of the collar, continues along the wall portion toward the at least one side wall of the reactor, and further extends between the shell structure and the at least one side wall of the reactor to the ventilation discharge connection.

2. The apparatus according to claim 1, wherein the heat exchanger element forms a heat transfer connection with the side wall of the reactor to transfer heat from the side wall of the reactor to the end edge and thereby to the reactor door.

3. The apparatus according to claim 1, wherein the heat exchanger element is arranged in the cooling channel at a distance of up to five centimetres from the end edge of the reactor.

4. The apparatus according to claim 1, wherein the heat exchanger element is made of material having a thermal conductivity of more than 50 $W \cdot m^{-1} \cdot K^{-1}$ preferably more than 100 $W \cdot m^{-1} \cdot K^{-1}$.

5. The apparatus according to claim 1, wherein the cooling channel extends between the ventilation discharge connection and the end edge of the reactor.

6. The apparatus according to claim 1, wherein the collar guides the cooling channel from the end edge toward the side wall of the reactor such that the cooling channel extends from the opening along the collar portion toward the wall portion of the collar, continues along the wall portion toward the at least one side wall of the reactor, and further extends between the shell structure and the at least one side wall of the reactor to the ventilation discharge connection.

7. The apparatus according to claim 1, wherein the heat exchanger element and the wall portion of the collar together define a portion of the cooling channel extending transversely with respect to the side wall of the reactor.

8. The apparatus according to claim 1, wherein the shell structure including the collar portion extends along the length of the side wall of the reactor and forms a hood around the reactor door.

9. The apparatus according to claim 1, wherein the reactor door comprises a door structure and a perforated plate arranged at a distance from the door structure such that a space is arranged between the door structure and the perforated plate.

10. The apparatus according to claim 9, wherein the perforated plate comprises inlet perforations at a lower part of the perforated plate formed to provide an air passage from an exterior side of the perforated plate to the space between the door structure and the perforated plate.

11. The apparatus according to claim 1, wherein the heat exchanger element is arranged between the at least one side wall of the reactor and the shell structure such that the heat exchanger element extends around the reactor and from the at least one side wall to the shell structure.

12. The apparatus according to claim 1, wherein the cooling channel extends around the reactor such that the opening of the cooling channel is formed between the shell structure and the end edge of the reactor and extends around the end edge of the reactor.

13. The apparatus according to claim 9, wherein the perforated plate comprises inlet perforations at a lower part of the perforated plate formed to provide an air passage from an exterior side of the perforated plate to the space between the door structure and the perforated plate and outlet perforations at an upper part of the perforated plate formed to provide an air passage from the space between the door structure and the perforated plate to the exterior side of the perforated plate for air to be guided to the collar.

14. The apparatus according to claim 1, wherein the at least one radiation shield plate is configured to cool the reactor door.

15. The apparatus according to claim 1, wherein the at least one radiation shield plate on the reactor door helps prevent radiation heat from entering the reactor door from within the reactor.

16. The apparatus according to claim 1, wherein the at least one radiation shield plate is attached to the inner side of the reactor door for preventing excess heat from entering the reactor door from within the reactor.

* * * * *